US007393725B2

(12) United States Patent
Kodaira

(10) Patent No.: US 7,393,725 B2
(45) Date of Patent: Jul. 1, 2008

(54) METHOD OF MANUFACTURING THIN FILM DEVICE ELECTRO-OPTIC DEVICE, AND ELECTRONIC INSTRUMENT

(75) Inventor: Taimei Kodaira, Nagano-ken (JP)

(73) Assignee: Seiko Epson Corporation (JP)

( * ) Notice: Subject to any disclaimer, the term of this patent is extended or adjusted under 35 U.S.C. 154(b) by 140 days.

(21) Appl. No.: 11/220,842

(22) Filed: Sep. 8, 2005

(65) Prior Publication Data

US 2006/0084205 A1    Apr. 20, 2006

(30) Foreign Application Priority Data

Oct. 19, 2004    (JP)    .............................. 2004-304645

(51) Int. Cl.
*H01L 21/00* (2006.01)
(52) U.S. Cl. ................................. 438/149; 257/E21.001
(58) Field of Classification Search ................. 438/149, 438/455, 458; 257/E21.001, E21.372, E21.411
See application file for complete search history.

(56) References Cited

U.S. PATENT DOCUMENTS

| 5,374,329 A | 12/1994 | Miyawaki |
| 6,887,650 B2 | 5/2005 | Shimoda et al. |

FOREIGN PATENT DOCUMENTS

| JP | 05-217824 | 8/1993 |
| JP | 10-125929 | 5/1998 |
| JP | 10-125930 | 5/1998 |
| JP | 10-125931 | 5/1998 |
| JP | 10/177187 | 6/1998 |
| JP | 11-251517 | 9/1999 |
| JP | 11-251518 | 9/1999 |
| JP | 2000-133809 | 5/2000 |
| JP | 2001-051296 | 2/2001 |
| JP | 2001-125138 | 5/2001 |
| JP | 2001-189460 | 7/2001 |
| JP | 2002-217390 | 8/2002 |
| JP | 2002-217391 | 8/2002 |
| JP | 2003-031778 | 1/2003 |
| JP | 2003-298029 | 10/2003 |

*Primary Examiner*—Scott B. Geyer
(74) *Attorney, Agent, or Firm*—Harness, Dickey & Pierce, P.L.C.

(57) ABSTRACT

A method of manufacturing a thin film device includes forming a pair of multi-layered structures by bonding a transfer layer including a thin film device to a temporary transfer substrate, respectively adhering the transfer layers of a pair of the multi-layered structures to both surfaces of a transfer-target substrate; and separating the temporary transfer substrate from each of the transfer layers adhered to the transfer-target substrate. The bonding step includes forming the transfer layer on a transfer-source substrate via a first separation layer separated in accordance with application of a predetermined amount of energy, bonding the transfer layer to the temporary transfer substrate, and separating the transfer-source substrate from the transfer layer by applying energy to the first separation layer to cause a boundary separation and/or an intra-layer separation in the first separation layer.

7 Claims, 12 Drawing Sheets

METHOD OF MANUFACTURING THIN FILM DEVICE ELECTRO-OPTIC DEVICE, AND ELECTRONIC INSTRUMENT

RELATED APPLICATION INFORMATION

This application claims priority to Japanese Application No. 2004-304645, filed Oct. 19, 2004, whose contents are expressly incorporated herein by reference.

BACKGROUND OF THE INVENTION

1. Technical Field

The present invention relates to a method of manufacturing a thin film device using an inter-substrate transfer technology for the thin film device.

2. Related Art

In semiconductor application devices such as liquid crystal display devices (LCD) or electroluminescence (EL) display devices, plastic substrates are sometimes used preferably as base substrates for the reason of preventing breakdown caused by deformation or dropping impacts, flexibility, or demands for weight saving. However, since the plastic substrates do not have enough heat resistance for a high temperature process required for manufacturing semiconductor devices, it is impossible to form semiconductor devices on the plastic substrates by an ordinary manufacturing process.

As a technology for forming a semiconductor device on a plastic substrate, a transfer technology has been proposed, in which a semiconductor application device is manufactured by attaching an element-forming layer (a layer to be transferred, hereinafter referred to as a transfer layer), which has a thin film semiconductor device formed therein and is detached from a heat resistive transfer-source substrate, to a plastic substrate, the transfer-target substrate after forming the thin film semiconductor device on the transfer-source substrate. Such a transfer technology is described as "a peeling method" or the like in, for example, Japanese Unexamined Patent Publications No. 10-125929, No. 10-125930, and No. 10-125931 in detail.

However, electro-optic instruments or electronic instruments in recent years are required to be packaged in high-density and low profiled, and accordingly, the thin film devices manufactured using the transfer technology described above are also required to be packaged in high-density without increasing thickness.

SUMMARY

In view of the above, an advantage of the invention is to provide a method of manufacturing a thin film device capable of realizing high-density and low profile packaging utilizing a transfer technology.

In view of the problem described above, a method of manufacturing a thin film device according to one aspect of the invention is a method of manufacturing a thin film device by transferring transfer layers to both surfaces of a transfer-target substrate and includes the step of forming a pair of multi-layered structures in which the transfer layer including a thin film device is bonded to a temporary transfer substrate, the step of respectively adhering the transfer layers of the pair of multi-layered structures to the both surfaces of the transfer-target substrate, the step of separating the temporary transfer substrate from each of the transfer layers adhered to the transfer-target substrate. The step of forming the pair of multi-layered structures includes the step of forming the transfer layer on a transfer-source substrate via a first separation layer separated in accordance with application of a predetermined amount of energy, the step of bonding the transfer layer to the temporary transfer substrate, and the step of separating the transfer-source substrate from the transfer layer by applying energy to the first separation layer to cause the boundary separation and/or the intra-layer separation.

According to the method described above, since the pair of transfer layers is temporarily fixed to the temporary transfer substrate, and then adhered to be transferred to the both surfaces of the single transfer-target substrate, and finally the temporary transfer substrate is separated, a thin film device can be provided on each surface of the transfer-target substrate using the transfer technology. Therefore, the thin film devices can be mounted in a high density while preventing the thickness becoming larger. Further, since the transfer layer is transferred to the transfer-target substrate using the transfer technology, the transfer-target substrate itself is not required to withstand a high temperature process or other processes in the manufacturing processes of the transfer layer, and accordingly, the thin film device manufactured in the high temperature process can be provided to, for example, a plastic substrate or the like.

Here, the transfer-target substrate in the invention is not limited to the plastic substrate, but various substrates such as a glass substrate or a ceramic substrate can be adopted.

Further, the separation layer is preferably formed of a material in which the binding power between atoms or molecules disappears or is reduced by irradiation with a light beam. This is because, by using the material having such characteristics, the irradiation with a light beam can easily make the physical binding power disappear or be reduced, thus making the separating operation easy.

Such a material preferably includes amorphous silicon. This is because, amorphous silicon has such characteristics as described above, and is easily separated from the transfer-source substrate.

Here, the step of bonding the transfer layer to the temporary transfer substrate includes the step of forming a second separation layer separated in accordance with application of a predetermined amount of energy on the temporary transfer substrate, and the step of bonding the second separation layer formed on the temporary transfer substrate and the transfer layer via an adhesive layer, and the step of separating the temporary transfer substrate can include the step of separating the temporary transfer substrate from the transfer layer by applying energy to the second separation layer to cause a boundary separation and/or an intra-layer separation in the second separation layer. According to the process described above, since the temporary transfer substrate is bonded via the second separation layer, the temporary transfer substrate can easily be separated by application of energy.

Further, in the step of respectively adhering the transfer layers to the both surfaces of the transfer-target substrate, the transfer layers are preferably adhered via adhesive layers. Since only the adhesive layer intervenes between the layers, the thin film device can be prevented from becoming thicker.

Further, a method of manufacturing a thin film device according to another aspect of the invention includes the step of manufacturing a multi-layered structure in which a transfer layer including a thin film device is transferred to a first surface of the transfer-target substrate, and the step of adhering a second surface of the transfer-target substrate having the transfer layer transferred to the first surface thereof to the other substrate provided with a thin film device while the second surface faces the other substrate According to the processes described above, the transfer layer is adhered to the first surface of the transfer-target substrate, and the second surface, the backside thereof is adhered to the other substrate having a thin film device, thus the thin film devices can be manufactured on both surfaces of the substrate. Therefore, high-density packaging is possible, and the whole of the thin film device can be made as a thin film by forming the substrate as thin as possible.

For example, if the other substrate is also the transfer-target substrate having the same transfer layer transferred thereon, the pair of such substrates can be provided with flexibility in each of the substrates.

Further, if the other substrate is a substrate having a thin film device stacked therein using a typical manufacturing method, for example, one of the substrates can be provided with higher rigidity than the other, and can be a glass substrate, for example. If the glass substrate is used, it is possible that the thin film device is directly formed on the substrate used as the transfer-source substrate, and then bonded with the other substrate.

For example, the step of manufacturing the multi-layered structure includes the step of forming the transfer layer on the transfer-source substrate via the first separation layer separated in accordance with application of energy, the step of bonding the transfer layer to the temporary transfer substrate, the step of separating the transfer-source substrate from the transfer layer by applying energy to the first separation layer to cause the boundary separation and/or the intra-layer separation, the step of adhering the transfer layer to the first surface of the transfer-target substrate, and the step of separating the temporary transfer substrate from the transfer layer. According to these steps, since each of the transfer layers is adhered to the transfer-target substrate after being formed on the transfer-source substrate, the substrate itself does not need to withstand the high temperature process in the manufacturing processes of the transfer layer, and accordingly, the thin film device manufactured using a high temperature process can be provided on, for example, a plastic substrate.

For example, the step of bonding the transfer layer to the temporary transfer substrate includes the step of forming the second separation layer separated in accordance with application of a predetermined amount of energy on the temporary transfer substrate, and the step of bonding the second separation layer formed on the temporary transfer substrate and the transfer layer to each other via the adhesive layer. Further, the step of separating the temporary transfer substrate includes the step of separating the temporary transfer substrate from the transfer layer by applying the second separation layer with energy to cause the boundary separation and/or the intra-layer separation in the second separation layer. According to this step, since the temporary transfer substrate is bonded via the second separation layer, the temporary transfer substrate can easily be separated by application of energy.

For example, the step of manufacturing the multi-layered structure includes the step of forming the transfer layer including a thin film device on the transfer-source substrate via the first separation layer separated in accordance with application of energy, the step of adhering the transfer layer to the first surface of the transfer-target substrate, and the step of separating transfer-source substrate from the transfer layer by applying the first separation layer with energy to cause the boundary separation and/or the intra-layer separation. According to the above steps, the transfer layer is adhered to the first surface of the transfer-target substrate after being formed on the transfer-source substrate, the substrate itself does not need to withstand the high temperature process in the manufacturing processes of the transfer layer, and accordingly, the thin film device manufactured using a high temperature process can be provided on, for example, a plastic substrate.

For example, in the step of adhering the second surface of the transfer-target substrate to the other substrate while facing each other, the second surface is adhered to the other substrate via the adhesive layer. Since only the adhesive layer intervenes between the layers, the thin film device can be prevented from becoming thicker.

Further, in the step of adhering the second surface of the transfer-target substrate to the other substrate while facing each other, the substrates are preferably pressure-bonded. Since the substrates are pressure-bonded without any intervening layers, the device can more easily be made as a thin film.

Here, for example, the thin film device includes one or more of a wiring film, an electrode, and a semiconductor device. This is because these items can be included in the transfer layer, and are thought to require electrical connections with the outside of the substrate.

For example, the adhesive layer is preferably made of a permanent adhesive. This is because the permanent adhesive can almost permanently be adhered to the transfer-target substrate.

Another aspect of the invention relates to an electro-optic device equipped with a thin film transistor manufactured using the method according to the above aspect of the invention. Here, "electro-optic device" denotes general devices equipped with an electro-optic device that emits light or changes the state of incident light using an electrical process, and includes, for example, in addition to an EL (electroluminescent) device a liquid crystal device, an electrophoretic device, and a device equipped with an electron emission device that emits light by making electrons generated by application of electric field collide against the light emitting plate.

Further, another aspect of the invention relates to an electronic instrument equipped with such an electro-optic device. "Electronic instrument" denotes a general instrument offering a certain function by a combination of a number of components of circuits, and is composed of, for example, an electro-optic device or a memory. The configuration thereof is not particularly limited, and for example, a television equipped with the electro-optic device described above, a roll-up television, a personal computer, a mobile phone, a video camera, a head-mount display, a rear type or a front type of video projector, a facsimile machine having a display function, a view finder of a video camera, a portable TV, a DSP device, a PDA, an electronic organizer, an electric bulletin board, an IC card, or an advertising display can be included.

BRIEF DESCRIPTION OF THE DRAWINGS

The invention will now be described with reference to the accompanying drawings, wherein like numbers refer to like elements, and wherein.

DESCRIPTION OF THE EMBODIMENTS

Preferred embodiments of the invention will now be described with reference to the accompanying drawings. Each of the embodiments described below is presented for an exemplification purpose only, and accordingly, does not limit the scope of the invention. Each of the present embodiments relates to a case in which a thin film transistor is manufactured as a thin film device.

First Embodiment

The method of manufacturing a thin film device according to the first embodiment of the invention is for providing thin film devices on both surfaces of the transfer-target substrate and basically includes the following processes:

(1) the process of forming a transfer layer including the thin film device on the transfer-source substrate via a first separation layer which is separated in accordance with application of a predetermined amount of energy;

(2) the process of bonding the transfer layer to the temporary transfer substrate; and (3) the process of separating the transfer-source substrate from the transfer layer by applying energy to the first separation layer to cause the boundary separation and/or the intra-layer separation in the first separation layer, thereby forming a pair of multi-layered structures each provided with the transfer layer bonded to the temporary transfer substrate; and further (4) the process of respectively adhering the transfer layers of the pair of multi-layered structures to the both surfaces of the transfer-target substrate; and (5) the process of separating the temporary transfer substrate form each of the transfer layers adhered to the transfer-target substrate, thereby transferring each of the transfer layers to the respective one of the both surfaces of the transfer-target substrate.

Further, the process (2) of bonding the transfer layer to the temporary transfer substrate includes the following processes:

(2-1) the process of forming on the temporary transfer substrate a second separation layer separated in accordance with application of a predetermined amount of energy; and (2-2) the process of bonding the second separation layer formed on the temporary transfer substrate with the transfer layer via an adhesive layer, and wherein the process (5) of separating the temporary transfer substrate includes the process of separating the temporary transfer substrate from the transfer layer by applying the second separation layer with energy to cause the boundary separation and/or the intra-layer separation in the second separation layer.

Hereinafter, the method of manufacturing a thin film device according to the first embodiment will be described with reference to FIGS. 1A through 1D, 2A through 2D, and 3. FIGS. 1A through 1D, 2A through 2D, and 3 are schematic cross-sectional views showing the manufacturing processes.

1. Process of Forming Transfer Layer

Figure 1A:
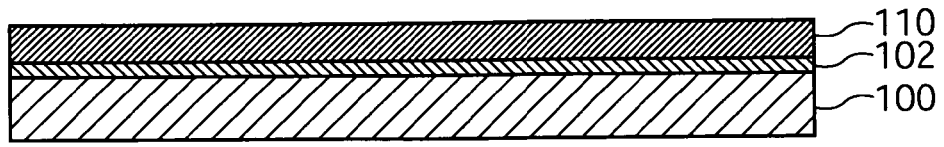
FIGS. 1A through 1D are cross-sectional views of the thin film device in manufacturing processes according to a first embodiment of the invention, and show a transfer layer forming process through a bonding process in one multi-layered structure.

As shown in FIG. 1A, the transfer layer 110 is formed on the transfer-source substrate 100 via the first separation layer 102.

As the transfer-source substrate (manufacture-source substrate) 100, a substrate having enough resistance to a high temperature process for manufacturing a thin film transistor, such as a translucent heat resistant substrate made of, for example, quartz glass resistant to heat of about 1000° C. can be adopted. As a material of the transfer-source substrate 100, heat-resistant glass such as soda glass, Corning 7059, or Nippon Electric Glass OA-2 can be used other than quartz glass. The thickness of the transfer-source substrate 100 is not strictly limited because it is not used in an end product, but is preferably in a range of about 0.1 mm through 1.5 mm. The transfer-source substrate with a too small thickness will cause reduction of the strength, and the transfer-source substrate with a too large thickness, on the contrary, will cause attenuation of irradiated light if the transmission factor of the transfer-source substrate is low. Note that, if the transfer-source substrate has a high transmission factor, the thickness thereof can go beyond the upper limit described above.

The first separation layer 102 has a property of separating in accordance with application of a predetermined amount of energy. The property of separating denotes a property of causing separation inside the layer or at boundaries with the adjacent layers (also referred to as "intra-layer separation" or "boundary separation") in accordance with irradiation with a laser beam or the like. Namely, by irradiated with light having predetermined strength, binding power between atoms or molecules forming the first separation layer 102 disappears or is reduced to cause ablation, thus resulting in separation. Further, in some cases, a gas is discharged from the first separation layer 102 in accordance with light irradiation to lead to separation. In one case, a component contained in the first separation layer 102 is discharged as a gas to lead to separation, and in the other case, the first separation layer 102 itself absorbs the light to be vaporized and the vapor is discharged to lead to separation.

As a composition suitable for the first separation layer 102 having such characteristics, amorphous silicon (a-Si), for example, can be used. The amorphous silicon can contain hydrogen (H) in it. The content of hydrogen is preferably greater than about 2 at %, and further preferably in a range of 2 at % through 20 at %. If hydrogen is contained, hydrogen discharged in response to irradiation of light causes inner pressure in the first separation layer 102 to promote separation. The content of hydrogen is adjusted by setting film forming conditions as desired, for example, in case CVD process is used, the film forming conditions include the composition of the gas, the pressure of the gas, the flow rate of the gas, the temperature of the substrate, the power of the light to be irradiated, and so on.

As other materials of the first separation layer 102 than the materials mentioned above, various oxide ceramics such as silicon oxide, a silicate compound, titanium oxide, or a titanate compound, dielectric materials, semiconductors, nitride ceramics such as silicon nitride, aluminum nitride, or titanium nitride, various organic polymer materials, or various metals can be adopted.

The thickness of the first separation layer 102 is preferably in a range of about 1 nm through 20 μm, and more preferably in a range of about 10 nm through 2 μm, and further more preferably in a range of about 40 nm through 1 μm. This is because, if the thickness of the first separation layer 102 is too small, the uniformity of the thickness of the formed film is degraded to cause unevenness in separation. Further, if the thickness of the first separation layer 102 is too large, the power (light intensity) of the irradiating light necessary for separation needs to be set bigger, or it takes more time to pattern the first separation layer 102 after separation.

As the method of forming the first separation layer 102, any methods capable of forming the separation layer in an even thickness can be adopted, and can be properly selected in accordance with various conditions such as compositions or the thickness of the first separation layer 102. For example, various vapor deposition processes such as a CVD (including MOCCVD, low-pressure CVD, ECR-CVD) process, an evaporation process, a molecular beam deposition (MB) process, a sputtering process, an ion plating process, or a PVD process, various plating processes such as an electroplating process, a dipping plating process, or an electroless plating process, coating processes such as a Langmuir-Blodgett (LB) process, a spin coat process, a spray coat process, or a roll coat process, various printing processes, a transfer process, an inkjet process, a powder-jet process, and so on can be adopted. Two or more of these processes can be used in combination. Further, in case the first separation layer 102 is formed by a sol-gel process with ceramics, or with an organic polymeric material, a coating process, in particular a spin coat process is preferably used to form the film.

The transfer layer 110 is an element-forming layer itself including the thin film device. The thin film device includes one or more of a wiring film, an electrode, and a semiconductor device. In the present embodiment, the case in which a thin film transistor (TFT) is formed as the thin film device is described as an exemplification.

Figure 3:
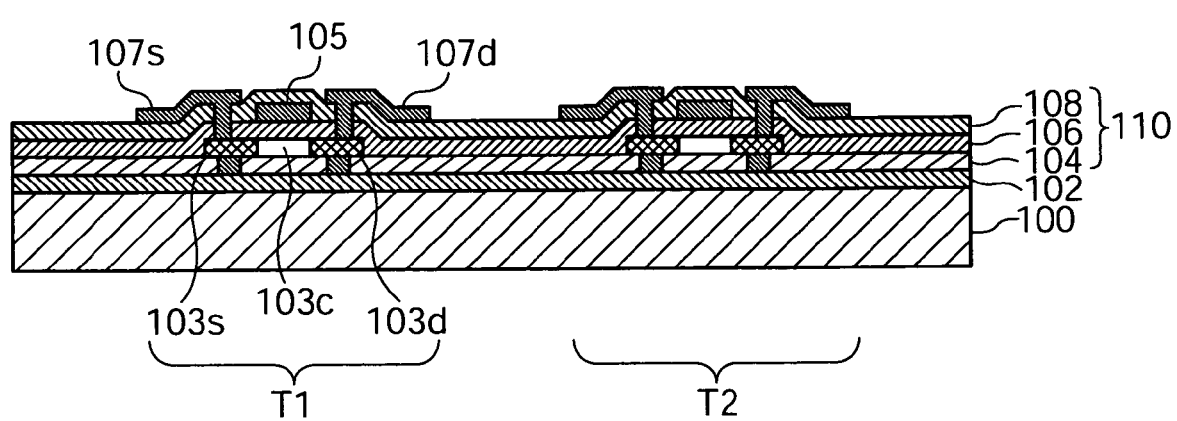
FIG. 3 is a cross-sectional view of the thin film device according to the present embodiment.

FIG. 3 shows an expanded cross-sectional view of the transfer layer 110 including a thin film transistors T1 and T2. As shown in FIG. 3, the transfer layer 110 includes a base layer 104 formed on the first separation layer 102 and the thin film transistors T1 and T2 formed on the base layer 104. Each of the thin film transistors T1 and T2 are composed of a semiconductor film 103 formed of a source 103s, a drain 103d, and a channel 103c, a gate insulating film 106, a gate electrode 105, an interlayer insulating film 108, and wiring layers 107s, 107d. The thin film transistors are manufactured using a typical thin film semiconductor manufacturing technology. The general outline of the technology will be hereinafter described as an exemplification.

The base layer 104 exerts at least one of following functions; a function of a protective layer for physically or chemically protecting the transfer layer when, for example, manufactured or used, a function of a insulating layer, a function of a barrier layer for preventing transition (migration) of a constituent thereof to or from the transfer layer, and a function of a reflecting layer.

The composition of the base layer can freely be elected in accordance with the purpose thereof, but preferably has a plurality of layers. If the base layer is formed between the separation layer made of amorphous silicon and the transfer layer as is the case with the present embodiment, silicon oxide such as SiO2 can be cited as the material of the base layer. In addition, various metals can also be cited. The thickness of the base layer 104 is properly decided in accordance with the purpose of forming the base layer. It is preferably in a range of about 10 nm through 5 μm in typical conditions, and further preferably in a range of about 40 nm through 1 μm. This is because the function of protective layer cannot be exerted with a base layer having a too small thickness, or the overall thickness is caused to be larger with a base layer having too large thickness. As a method of forming the base layer 104, the various methods described in relation to the first separation layer 102 can be adopted. Here, the CVD process is used to deposit a silicon oxide film. Note that the base layer can be formed of a single layer or a plurality of layers using a plurality of members of the same composition or of different compositions from each other.

The semiconductor film 103 is formed using a known semiconductor thin film forming technology. For example, a silicon film is formed on the base layer 104 by depositing silicon thereon using the CVD process. Subsequently, by patterning the silicon film to have the same shape as the transistor region of the thin film transistor, the semiconductor film 103 is formed.

After the semiconductor film 103 is formed, the thin film transistor including the semiconductor film 103 as its transistor region is then formed. Before all, the gate insulating film 106 is formed by depositing silicon using the CVD process and then oxidizing the deposited silicon or by directly depositing silicon oxide or the like. Subsequently, ion implantation is executed on the semiconductor film 103 to form the channel 103c. And then, the gate electrode 105 is formed by patterning a deposited metal film made of tantalum or the like or a polysilicon highly doped with impurities deposited using the CVD process. Subsequently, by heavily doping impurities on the source 103s and drain 103d regions of the semiconductor film 103 using the gate electrode 105 as a mask, the source 103s and drain 103d are formed in a self-aligning manner. Subsequently, a heat process for activating the impurities is executed, and the interlayer insulating film 108 is formed by depositing a silicon oxide film using the CVD process. The interlayer insulating film 108 is provided with contact holes reaching the source 103s and the drain 103d, respectively. And, by patterning the polysilicon heavily doped with impurities deposited using the CVD process, or the metal film deposited using a sputtering process, the wiring layers 107s, 107d are formed.

As shown in FIG. 3, the transfer layer (the element-forming layer) 110 including the thin film transistors T1 and T2 as the thin film devices is thus formed. The method of forming the thin film transistor is not limited to the above, but various known thin film semiconductor manufacturing technologies can be adopted thereto. As a thin film device that can be included in the transfer layer 110, a passive component such as a pixel electrode, a connection pad, a resistor, and a capacitor can be cited other than the thin film transistor.

Note that, although the transfer layer 110 is a thin film including the thin film device in the above embodiment, the transfer layer is not limited to a thin film, but can be a thick film such as a coated film or a sheet.

2. Temporary Transfer Substrate Bonding Process

Figure 1B:
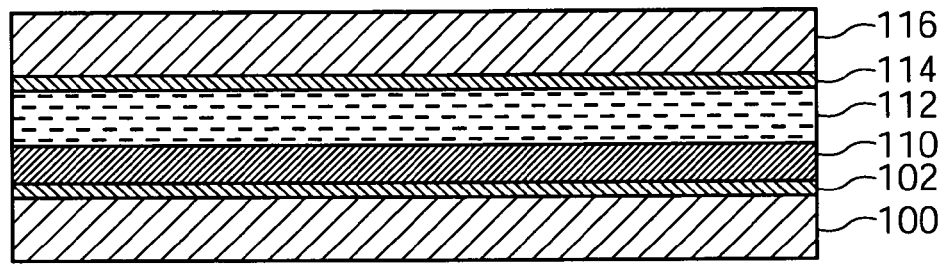

As shown in FIG. 1B, the transfer layer 110 is then bonded with the temporary transfer substrate 116.

Firstly, the second separation layer 114, which is separated in response to application of a predetermined amount of energy, is formed on the temporary transfer substrate 116 (step 2-1). Since the temporary transfer substrate 116 is not implemented in a product as the end substrate, the same material as of the transfer-source substrate 100 can be used therefor. The composition, the forming method, and the thickness of the second separation layer 114 are also the same as those of the first separation layer 102.

Subsequently, the second separation layer 114 formed on the temporary transfer substrate 116 is bonded with the transfer layer 110 via an adhesive layer 112 (step 2-2). The adhesive layer 112 is formed by coating an adhesive on either the transfer layer 110 or the second separation layer 114 using a spin coating process or the like. As the adhesive, for example, various types of curing adhesives such as a reaction-curing adhesive, a heat curing adhesive, a light curing adhesive, an anaerobic curing adhesive can be adopted. The composition thereof can appropriately be selected from an epoxy type, an acrylate type, a silicone type, and so on. The amount of the adhesive is preferably controlled as small as possible so that the thickness of the adhesive layer 112 can be as small as possible when it is removed. Further, if the adhesive layer 112 is used as a so-called protective layer and accordingly, implemented in the end product, the thickness is determined so as to exert a sufficient protective performance. However, since an advantage of the present embodiment of the invention is to form the thin film device thinner, the thickness is preferably determined in a certain range suitable for taking the advantage.

3. Separation Process

Figure 1C:
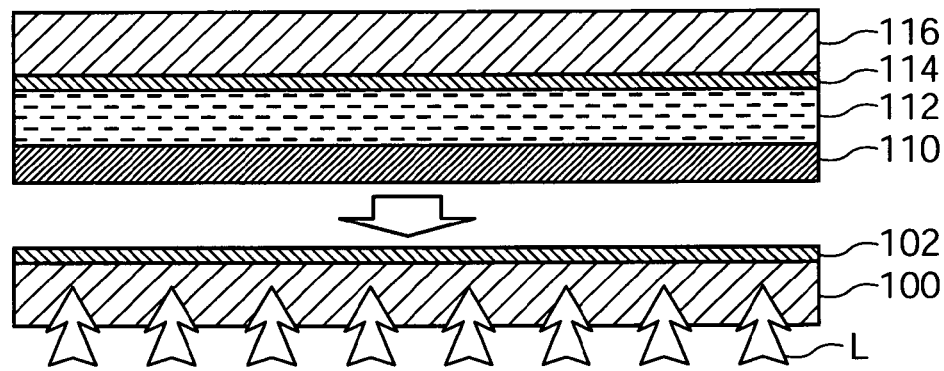

As shown in FIG. 1C, by applying energy to the first separation layer 102 to cause the boundary separation and/or the intra-layer separation in the first separation layer 102, the transfer-source substrate 100 is separated from the transfer layer 110.

The energy is preferably applied by irradiation with a laser beam. Although any types of laser beams can be used as long as they can cause the intra-layer separation and/or the boundary separation in the first separation layer 102, the excimer laser is especially preferable because it can output high energy in a short wavelength region to cause ablation in the separation layer in a very short period of time. The energy density of the laser beam in the excimer laser is preferably in a range of about 10 through 5000 mJ/cm2, and preferably in a rage of about 100 through 5299 mJ/cm2. The irradiation time period is preferably in a range of about 1 through 1000 ns, and further preferably in a rage of about 10 through 100 ns. This is because, if the energy density is too low or the irradiation time is too short, a sufficient ablation does not occur, or if the energy density is too high or the irradiation time is too long, the irradiated light passing through the first separation layer 102 and the base layer 194 may cause an adverse effect to the semiconductor film 103.

The whole of the separation layer is preferably irradiated with the laser beam so that the density thereof is even throughout the layer. The direction of irradiation with the light beam is not limited to the perpendicular direction to the separation layer, but can be a direction at a predetermined angle with the separation layer. Further, if the area of the separation layer is larger than the area of the irradiation range with a single shot of the irradiating light, the irradiation of the whole of the separation layer can be executed with a number of shots of the irradiating light. Further, a number shots of the irradiating light can be executed on the same area. Further, the same area or the different areas can be irradiated a number of times with a number of light beams of different kinds or of different wavelengths (wavelength ranges).

By repeatedly executing the transfer layer forming process, the temporary transfer substrate bonding process, the separation process described above, at least a pair of multi-layered structures each including the transfer layer 110, the adhesive layer 112, the second separation layer 114, and the temporary transfer substrate 116 is manufactured. And then, a following process will be executed.

4. Transfer-Target Substrate Adhering Process

Figure 1D:
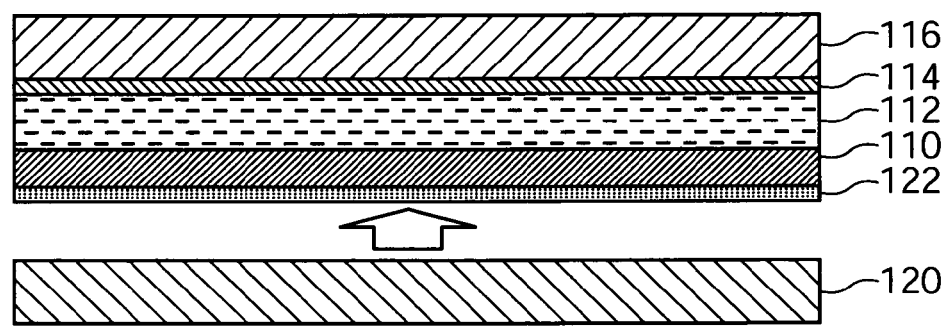
Figure 2A:
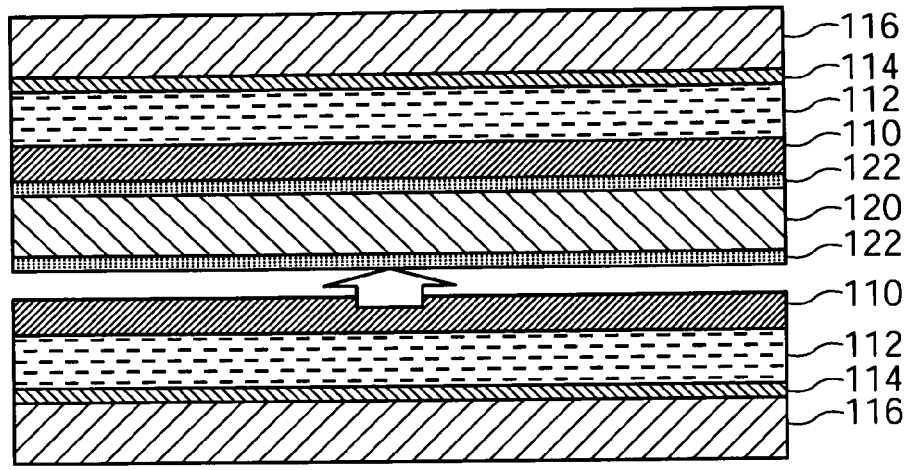
FIGS. 2A through 2D are cross-sectional views of the thin film device in manufacturing processes according to the first embodiment of the invention, and show a bonding process through a temporary transfer substrate peeling process in the other multi-layered structure.

As shown in FIG. 1D and FIG. 2A, the both surfaces of the transfer-target substrate 120 are respectively adhered to the pair of transfer layers 110 each formed through the processes described above and having the multi-layered structure.

The transfer-target substrate is used as a permanent substrate, and accordingly, those inferior in heat resistance or in corrosion resistance to the transfer-source substrate can also be used therefor. Further, those having low rigidity, flexibility, or elasticity can also be adopted. As an example of such a material, various synthetic resins can be cited. The synthetic resins include both of thermoplastic resins or thermoset resins, and for example, polyethylene, polypropylene, ethylene-propylene copolymer, or others can be adopted. Note that glass materials such as quartz glass, alkali silicate glass, soda lime glass, or others can be adopted.

Note that, as the transfer-target substrate 120, those forming independent devices by themselves, or members each forming a part of a device such as a color filter, an electrode layer, a dielectric layer, an insulating layer, or a semiconductor element can also be used other than the substrate made of a single material.

Here, the transfer layers 110 are adhered to the both surfaces of the transfer-target substrate 120 via the adhesive layers 122. The adhesive layers 122 are preferably formed of a permanent adhesive. This is because the permanent adhesive can almost permanently be adhered to the transfer-target substrate. As the adhesive capable of almost permanently adhering the substrate, an epoxy type or an acrylate type, for example, can be used. The adhesive layer 122 is preferably formed as thin as possible, and the material thereof is selected to have good affinities with the transfer layer 110 and the transfer-target substrate 120.

5. Temporary Transfer Substrate Separating Process

Figure 2B:
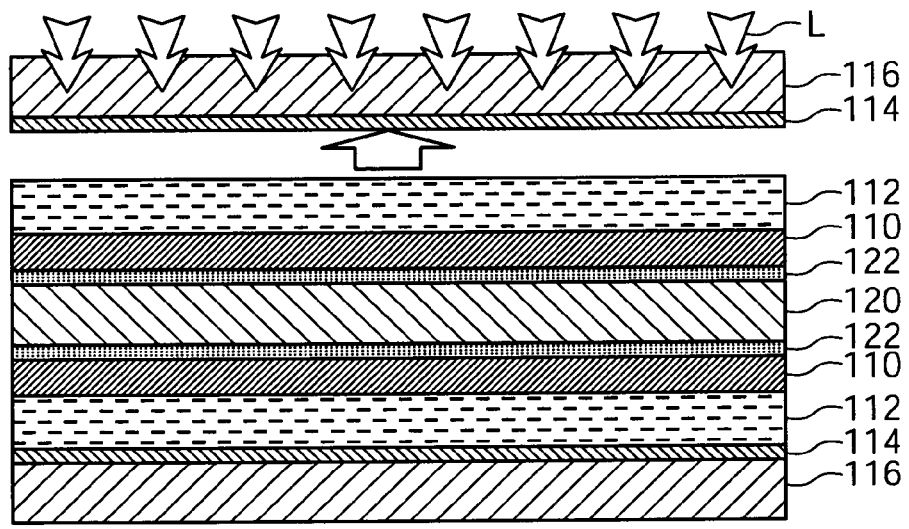
Figure 2C:
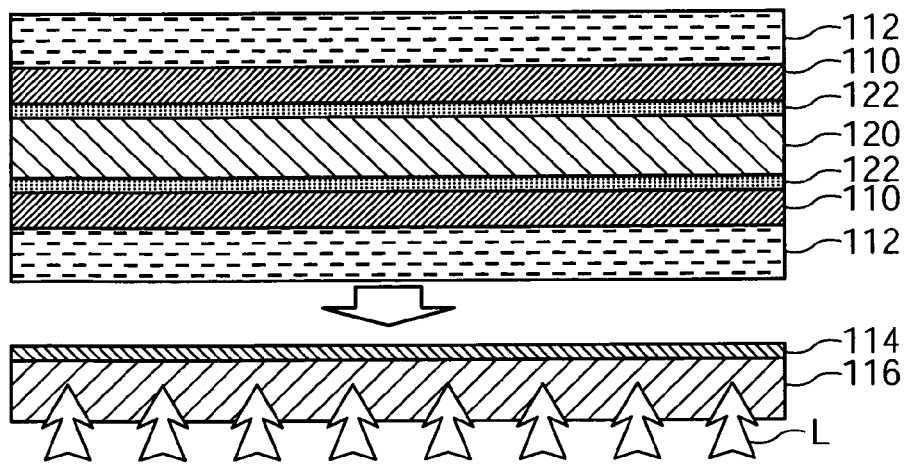

As shown in FIGS. 2B and 2C, after adhering the multi-layered structures to the transfer-target substrate 120, the temporary transfer substrate 116 is separated from each of the transfer layers 110. Specifically, by applying energy to the second separation layer 114 to cause the boundary separation and/or the intra-layer separation in the second separation layer 114, the temporary transfer substrate 116 is separated from the transfer layer 110. The point that the application of energy by a laser beam is preferable, and other aspects of irradiation are thought to be identical to the case with the first separation layer 102.

Figure 2D:
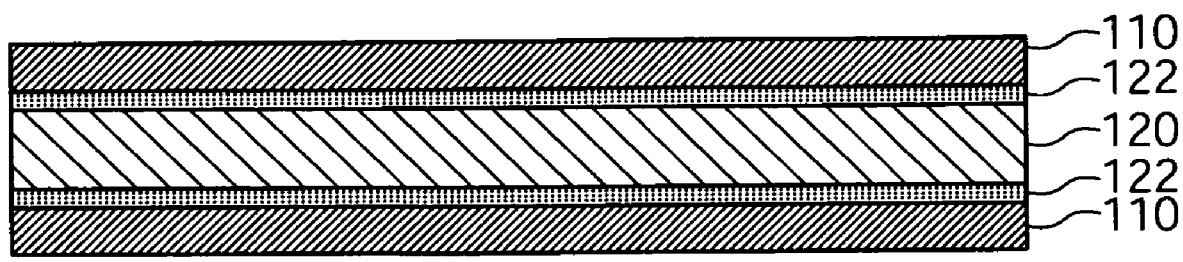

If the adhesive layer 112 is used as the protective film in an end product, the thin film device is completed in a stage in which the pair of temporary transfer substrates 116 are separated therefrom as shown in FIG. 2C. In contrast, if the adhesive layers 112 are removed, the adhesive layers 112 are removed using a solvent or the like in accordance with the characteristic of the adhesive to obtain the thin film device in which the transfer-target substrate 120 is provided with one transfer layer 110 adhered to each of the both surfaces thereof via the adhesive layer 122 (FIG. 2D).

Note that, although the temporary transfer substrate 116 and the adhesive layer 112 is bonded via the second separation layer 114 in the first embodiment above, the temporary transfer substrate 116 can directly be bonded to the adhesive layer 112. In this case, a thermoplastic material or a material having optical plasticity is used for the adhesive forming the adhesive layer 112, or the adhesive is re-softened after temporarily adhering to select the adhesive with which the temporary transfer substrate 116 can easily be separated.

As described above, according to the manufacturing method of the first embodiment, since the transfer layer 110 is transferred to each of the both surfaces of a single transfer-target substrate 120 after preliminary fixed on the temporary transfer substrate 116, and then the temporary transfer substrates 116 are separated therefrom, the thin film devices can be formed on the both surfaces of the one transfer-target substrate 120. Therefore, the thin film devices can be mounted in a high density while preventing the thickness becoming larger.

Further, according to the manufacturing method of the first embodiment, since the transfer layer is transferred to the transfer-target substrate using the transfer technology, the transfer-target substrate itself is not necessarily required to have enough heat resistance or corrosion resistance against the high temperature process in the manufacturing processes of the transfer layer, and accordingly, thin film devices manufactured in a high temperature process can be provided to, for example, a plastic substrate.

Further, according to the manufacturing process of the first embodiment, since the temporary transfer substrate 116 is bonded via the second separation layer 114, the temporary transfer substrate 116 can easily be separated by irradiation with a laser beam.

Further, according to the manufacturing method of the first embodiment, the transfer layer 110 is adhered to the transfer-target substrate 120 via the ultrathin adhesive layer 122, the thin film device can be prevented from becoming thicker.

Second Embodiment

A method of manufacturing a thin film device according to the second embodiment of the invention relates to an aspect of bonding backsides of a pair of transfer-target substrates each having a thin film device transferred thereto, and basically including the following processes:

(1) the process of manufacturing a multi-layered structure in which a transfer layer including the thin film device is transferred to a first surface of the transfer-target substrate; and (2) the process of adhering a second surface of the transfer-target substrate, which has the transfer layer adhered thereto, to a surface of another transfer-target substrate (manufactured in the process (1)) including a thin film device while facing each other.

Especially in the second embodiment, the process (1) of manufacturing the multi-layered structure includes the following processes:

(1-1) the process of forming the transfer layer on the transfer-source substrate via a first separation layer which is separated in response to application of energy;

(1-2) the process of bonding the transfer layer to the temporary transfer substrate;

(1-3) the process of separating the transfer-source substrate from the transfer layer by applying energy to the first separation layer to cause the boundary separation and/or the intra-layer separation in the first separation layer;

(1-4) the process of adhering the transfer layer to the first surface of the transfer-target substrate; and (1-5) the process of separating the temporary transfer substrate from the transfer layer.

And, the process (1-2) of bonding the transfer layer to the temporary transfer substrate further includes the following processes:

(1-2-1) the process of forming on the temporary transfer substrate a second separation layer separated in accordance with application of a predetermined amount of energy; and (1-2-2) the process of bonding the second separation layer formed on the temporary transfer substrate with the transfer layer via an adhesive layer. In this case, the process (1-5) of separating the temporary transfer substrate includes (1-5-1) the process of separating the temporary transfer substrate from the transfer layer by applying the second separation layer with energy to cause the boundary separation and/or the intra-layer separation in the second separation layer.

Hereinafter, the method of manufacturing a thin film device according to the second embodiment will be described with reference to schematic cross-sectional views of the thin film devices in the manufacturing process shown in FIGS. 4A through 4F, 5A and 5B. As shown in FIG. 4F, the multi-layered structure to be manufactured by the present processes denotes a structure in which the transfer layer 110 is adhered on the transfer-target substrate 120 via the adhesive layer 122. The manufacturing method will hereinafter be described.

1. Multi-layered Structure Manufacturing Process

Figure 4A:
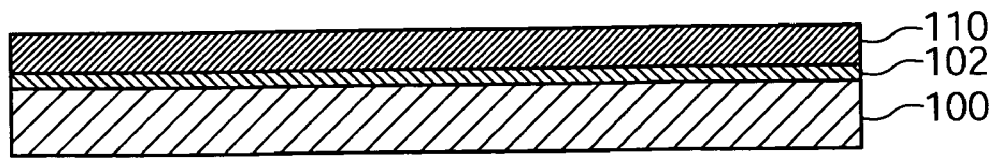
FIGS. 4A through 4F are cross-sectional views of the thin film device in manufacturing processes according to a second embodiment of the invention, and particularly show manufacturing processes of one multi-layered structure.

As shown in FIG. 4A, the transfer layer 110 is formed on the transfer-source substrate 100 via the first separation layer 102 which is separated in response to application of energy (1-1). This process is executed similarly to the transfer layer forming process in the first embodiment.

Figure 4B:
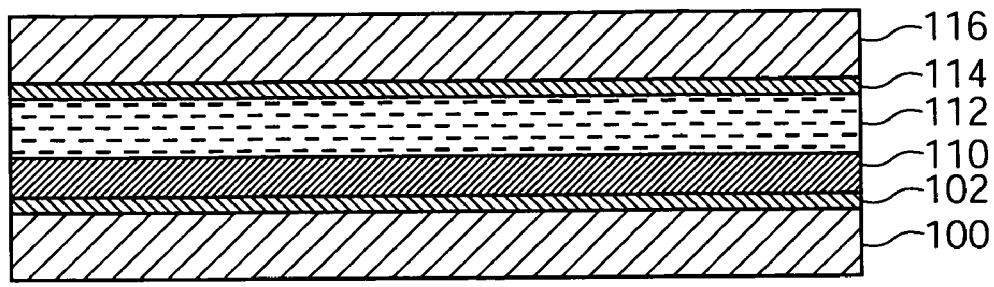

As shown in FIG. 4B, the transfer layer 110 is then bonded with the temporary transfer substrate 116 (1-2). This process is executed also similarly to the temporary transfer substrate bonding process in the first embodiment. Namely, the second separation layer 114, which is separated in response to application of a predetermined amount of energy, is formed on the temporary transfer substrate 116 (1-2-1), and the second separation layer 114 formed on the temporary transfer substrate 116 and the transfer layer 110 are further bonded with each other via the adhesive layer 112 (1-2-2).

Figure 4C:
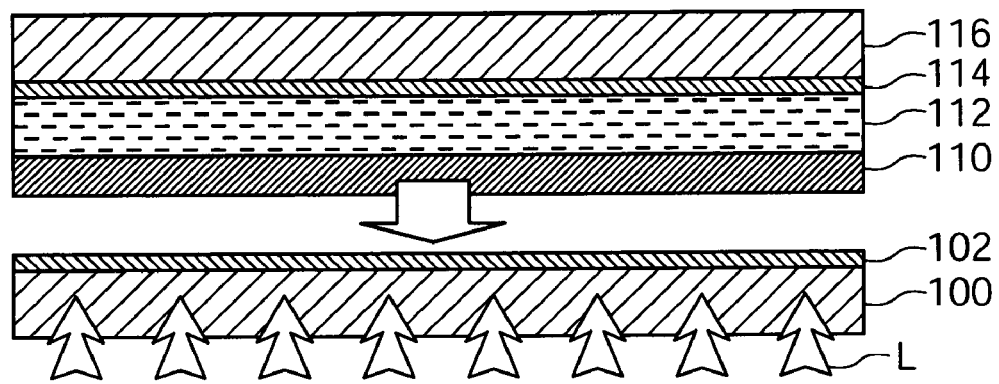

As shown in FIG. 4C, by applying energy to the first separation layer 102 to cause the boundary separation and/or the intra-layer separation in the first separation layer 102, the transfer-source substrate 100 is then separated from the transfer layer 110 (1-3). This process is executed also similarly to the separating process in the first embodiment.

Figure 4D:
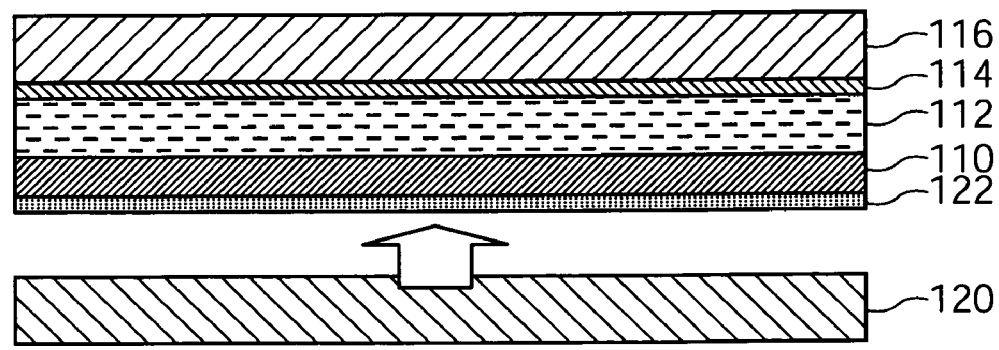

As shown in FIG. 4D, the transfer layer 110 is then adhered to the first surface of the temporary transfer substrate 120 (1-4). This process is executed also similarly to the transfer-target substrate adhering process in the first embodiment.

Figure 4E:
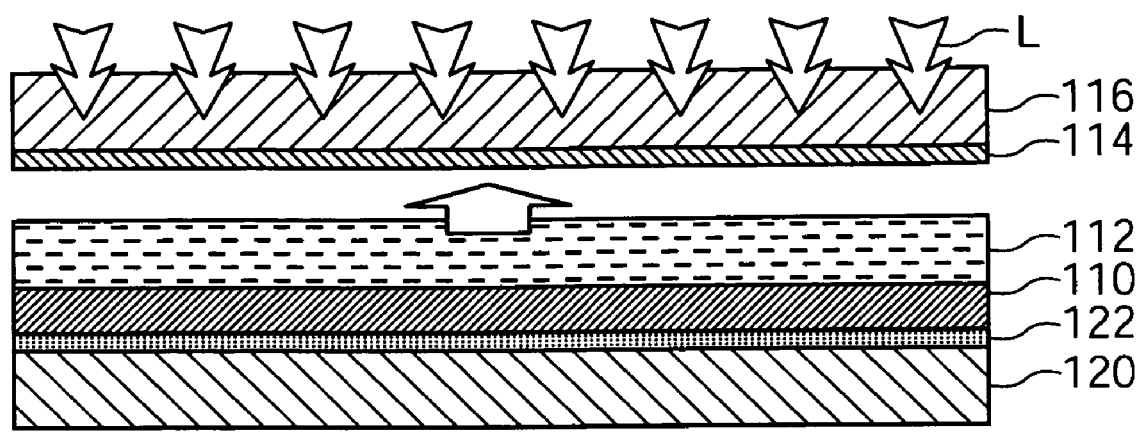
Figure 4F:
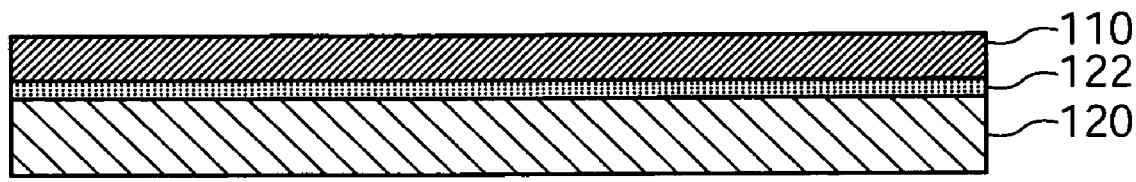

As shown in FIG. 4E, the transfer layer 110 is then separated from the temporary transfer substrate 116 (1-5). This process is executed similarly to the temporary transfer substrate separating process in the first embodiment. Namely, by applying energy to the second separation layer 114 to cause the boundary separation and/or the intra-layer separation in the second separation layer 114, the temporary transfer substrate 116 is separated from the transfer layer 110 (1-5-1).

Thus, the multi-layered structure in which the transfer layer 110 is adhered and transferred on the transfer-target substrate 120 with the adhesive layer 122 is formed through the above processes (FIG. 4F). In the second embodiment, a pair of multi-layered structures is manufactured, and the multi-layered structures are adhered to each other.

2. Second Surface of the Transfer-Target Substrate Adhering Process

Figure 5A:
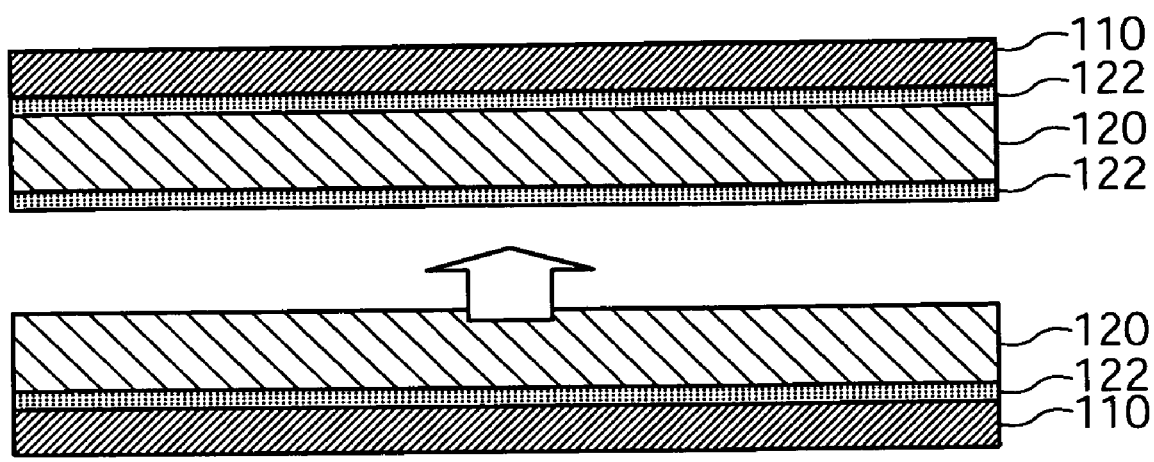
FIGS. 5A and 5B are cross-sectional views showing a bonding process of a pair of multi-layered structures according to the second embodiment.
Figure 5B:
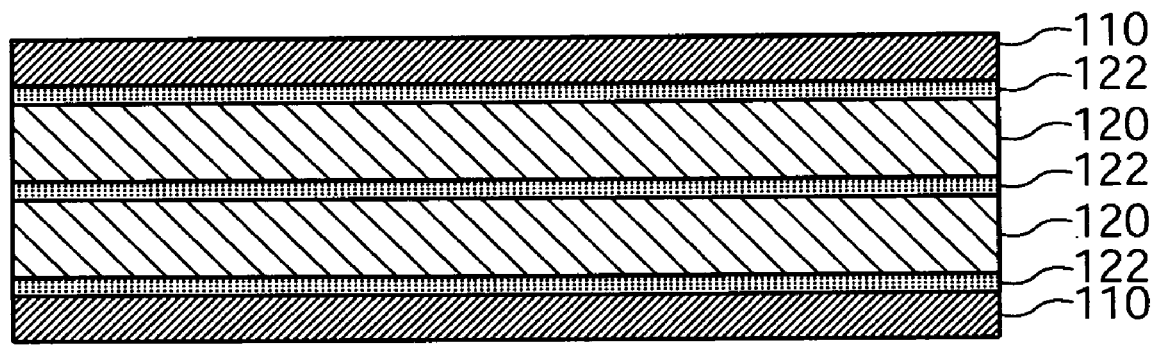

As shown in FIG. 5A, an adhesive is deposited on the second surface (backside) of the transfer-target substrate 120 in one of the multi-layered structures to form the adhesive layer 122, and the adhesive layer 122 is then adhered to the second surface of the transfer-target substrate 120 in the other of the multi-layered structures. As the adhesive for the adhesive layer 122, the same adhesive as used for adhering the transfer-target substrate 120 with the transfer layer 110 can be used. The pair of transfer-target substrates 120 thus adhered to each other is provided with flexibility in both sides.

As described above, according to the second embodiment, since the transfer layer 110 is adhered to the first surface of each of the pair of transfer-target substrates 120, and the second surfaces, the backsides of the transfer-target substrates 120 are adhered to each other, the thin film devices can be mounted on both sides of the adhered transfer-target substrates, thus enabling high-density packaging. In this case, by forming the transfer-target substrate as thin as possible, the whole of the thin film device can be made as a thin film.

Further, according to the second embodiment, since each of the transfer layers 110 is adhered to the transfer-target substrate 120 after being formed on the transfer-source substrate 100, the transfer-target substrate 120 itself does not need to withstand the high temperature process in the manufacturing processes of the transfer layer 110, and accordingly, the thin film device manufactured using a high temperature process can be provided on, for example, a plastic substrate.

Further, according to the second embodiment, since the temporary transfer substrate 116 is bonded via the second separation layer 114, the temporary transfer substrate 116 can easily be separated by application of energy.

Further, according to the second embodiment, since the second surfaces of the pair of transfer-target substrates are adhered to each other only via the adhesive layer 122 and exclude any other structure than the adhesive layer therebetween, the thin film device can be prevented from becoming like a thick film.

Third Embodiment

A method of manufacturing a thin film device according to a third embodiment of the invention relates to a modified example of the second embodiment, in which one of the pair of multi-layered structures adhered in the second embodiment is replaced with a structure manufactured by a typical method of manufacturing a thin film semiconductor device.

Figure 6A:
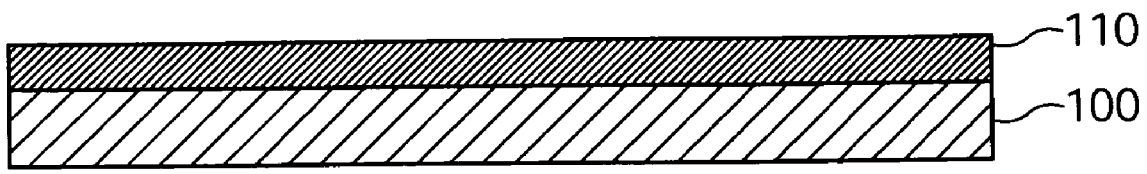
FIGS. 6A through 6C are cross-sectional views showing a bonding process of a pair of multi-layered structures according to a third embodiment.
Figure 6B:
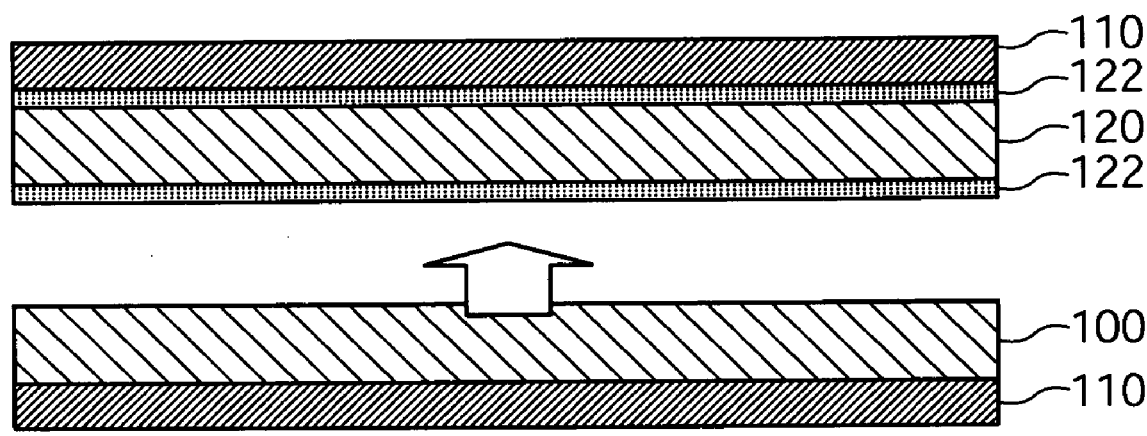
Figure 6C:
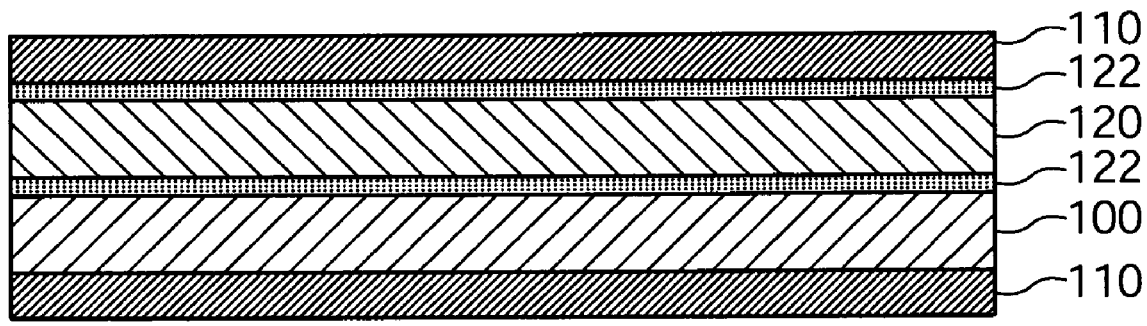

FIGS. 6A through 6C are schematic cross-sectional views of a pair of substrates in an adhering process of the manufacturing processes according to the third embodiment.

As shown in FIG. 6A, a substrate 100, which is used in a typical manufacturing method of a thin film semiconductor device, is used, and a thin film device 110 is directly formed on the substrate 100 using a typical manufacturing method of a thin film semiconductor device without using any transfer technologies. Therefore, the multi-layered structure shown in FIG. 6A is formed by directly forming the thin film device 110 (corresponding to the transfer layer described above) on the substrate 100 (corresponding to the transfer-source substrate described above) made of glass or the like and used in a typical manufacturing method of a semiconductor device.

Meanwhile, a multi-layered structure, in which the transfer layer 110 is adhered on the transfer-target substrate 120 having relatively low rigidity using the transfer technology, is separately manufactured. The multi-layered structure is manufactured in, for example, the second embodiment, and is formed by transferring the transfer layer 110 on the transfer-target substrate 120 abounding with flexibility. Therefore, one substrate 100 of the pair of substrates to be adhered to each other has higher rigidity in comparison with the other substrate 120.

As shown in FIG. 6B, the second surface of the transfer-target substrate 120 and the other substrate 100 are adhered to each other with the adhesive layer 122 or the like to complete the thin film device (FIG. 6C).

According to the third embodiment described above, since the multi-layered structure manufactured by a typical manufacturing method of a thin film device can be used as one of the pair of multi-layered structures to be adhered to each other, the high-density packaging can be provided among a thin film device manufactured by a typical manufacturing method of a thin film semiconductor device and a thin film device manufactured using transfer technology.

Fourth Embodiment

A method of manufacturing a thin film device according to a fourth embodiment of the invention relates to a modified example of the process of adhering the second surfaces of a pair of transfer-target substrates each provided with the transfer layer adhered thereto while facing each other in the second embodiment.

Figure 7A:
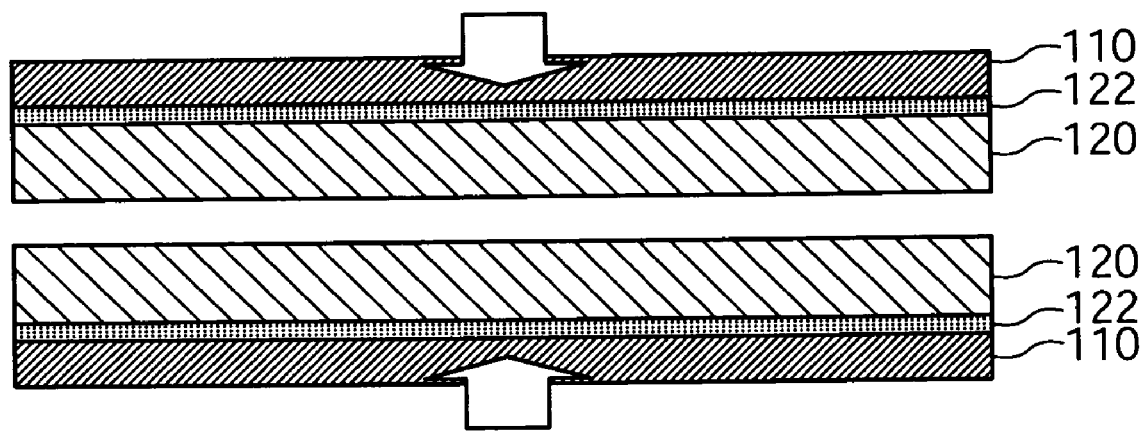
FIGS. 7A and 7B are cross-sectional views showing a bonding process of a pair of multi-layered structures according to a fourth embodiment, which is a modified example of the second embodiment.
Figure 7B:
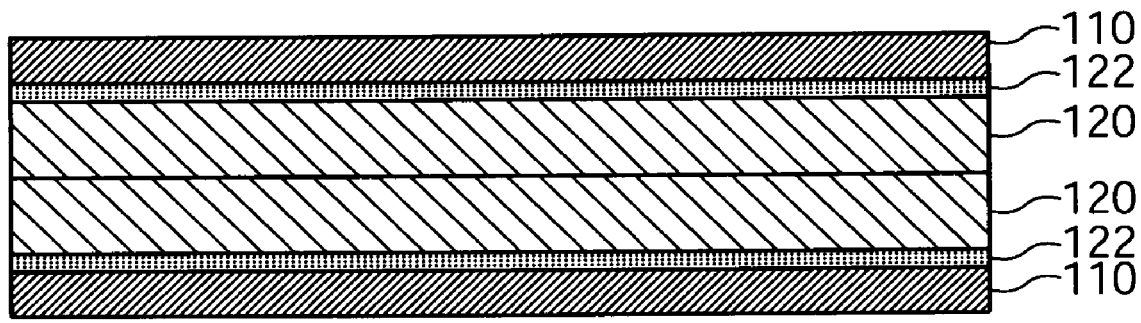

FIGS. 7A and 7B are schematic cross-sectional views of a pair of substrates in an adhering process of the manufacturing processes according to the fourth embodiment.

As shown in FIG. 7A, when adhering the multi-layered structures manufactured in the second embodiment, the second surfaces of the transfer-target substrates are bonded with pressure by applying pressure therebetween without using any adhesives in the present embodiment. The pressure for the pressure bonding can be controlled in a rage not causing stresses to the transfer layer 110. Further, it is preferable that the second surfaces of the transfer-target substrates are heated to be a condition in which meltdown of the surfaces easily occurs when the pressure bonding is executed. As shown in FIG. 7B, the pair of transfer-target substrates 120 is combined by the pressure bonding process without any substances intervening therebetween.

According to the fourth embodiment, if the transfer-target substrate 120 is a plastic substrate formed of resin, local meltdown is caused by application of pressure, and the substrates are fused and adhered to each other without using any adhesives. Namely, according to the fourth embodiment, since the pair of transfer-target substrates 120 is pressure-bonded without any intermediate layers such as an adhesive layer, a thinner film can be provided while providing high-density packaging.

Fifth Embodiment

A fifth embodiment of the invention relates to a modified example of the multi-layered structure manufacturing process in the method of manufacturing the multi-layered structure according to the second embodiment.

In the fifth embodiment, the process (1) of manufacturing a pair of multi-layered structures includes the following processes:

(1) the process of forming a transfer layer including a thin film device on the transfer-source substrate via a first separation layer which is separated in accordance with application of energy;

(2) the process of adhering the transfer layer to the first surface of the transfer-target substrate; and (3) the process of separating the transfer-source substrate from the transfer layer by applying energy to the first separation layer to cause the boundary separation and/or the intra-layer separation in the first separation layer.

Figure 8A:
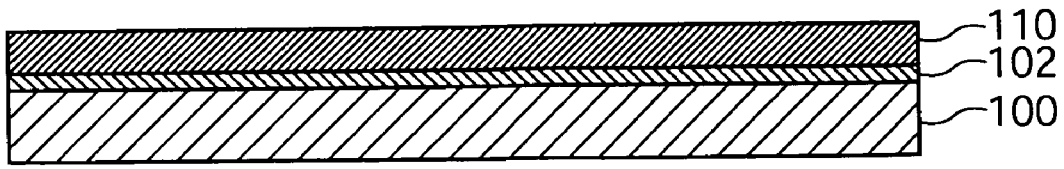
FIGS. 8A through 8D are cross-sectional views of the thin film device in manufacturing processes according to a fifth embodiment of the invention, and particularly show manufacturing processes of one multi-layered structure.

Hereinafter, the method of manufacturing a thin film device according to the fifth embodiment will be described with reference to schematic cross-sectional views of the structure in manufacturing processes shown in FIGS. 8A through 8D. As shown in FIG. 8F, similarly to the second embodiment, the multi-layered structure to be manufactured by the present processes is a structure in which the transfer layer 110 is adhered on the transfer-target substrate 120 via the adhesive layer 122.

As shown in FIG. 8A, the transfer layer 110 is formed on the transfer-source substrate 100 via the first separation layer 102 which is separated in response to application of energy (1). This process is the same as described in the second embodiment.

Figure 8B:
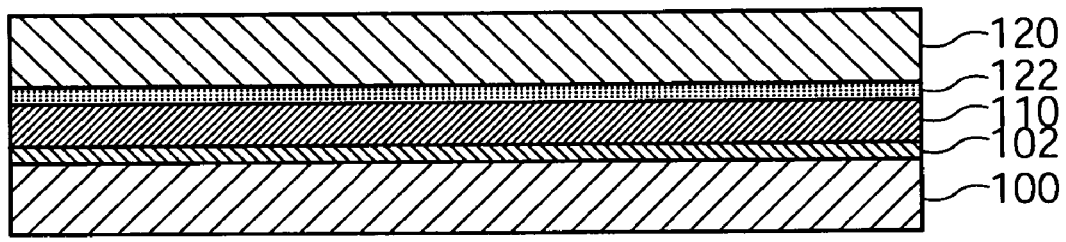

As shown in FIG. 8B, the other surface of the transfer layer 110 and the transfer-target substrate 120 are subsequently adhered via the adhesive layer 122 (2). The adhesive layer 122 is as described above.

Figure 8C:
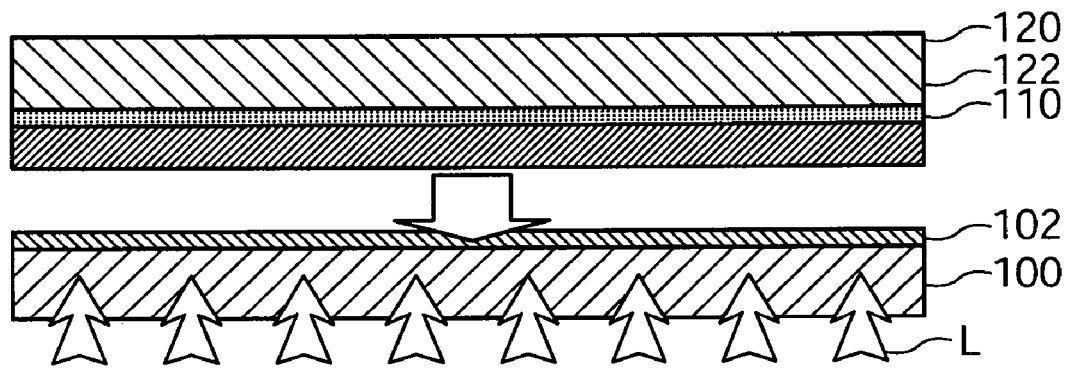

As shown in FIG. 8C, by applying energy to the first separation layer 102 to cause the boundary separation and/or the intra-layer separation in the first separation layer 102, the transfer-source substrate 100 is then separated from the transfer layer 110 (3). This process is also the same as described in the second embodiment.

Figure 8D:
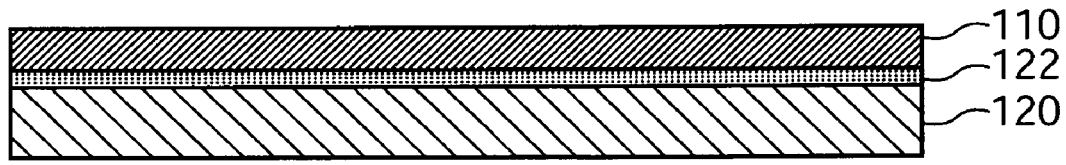

The transfer layer 110 is transferred to the transfer-target substrate 120 though the above processes (FIG. 8D). Since the transfer process is executed on the transfer-target substrate 120 only once in the present embodiment, attention should be paid to the fact that the front and the back of the thin film device are reversed when the thin film device formed on the transfer-source substrate 100 is transferred to the transfer-target substrate 120. Namely, when the multi-layered structure manufactured by the manufacturing process of the present embodiment is laminated, it is adhered with the front side and the backside of the thin film device upside down. Therefore, the thin film device capable of being used for the present embodiment is preferably a device, an element, or an electrode that can be used if its sides are reversed from the orientation as manufactured.

According to the fifth embodiment, since the transfer layer 110 is adhered to the transfer-target substrate 120 after being formed on the transfer-source substrate 100, the transfer-target substrate 120 itself does not need to withstand the high temperature process in the manufacturing processes of the transfer layer 110, and accordingly, the thin film device manufactured using a high temperature process can be provided on, for example, a plastic substrate.

Sixth Embodiment

A sixth embodiment of the invention relates to an exemplification of an electro-optic device.

Figure 9:
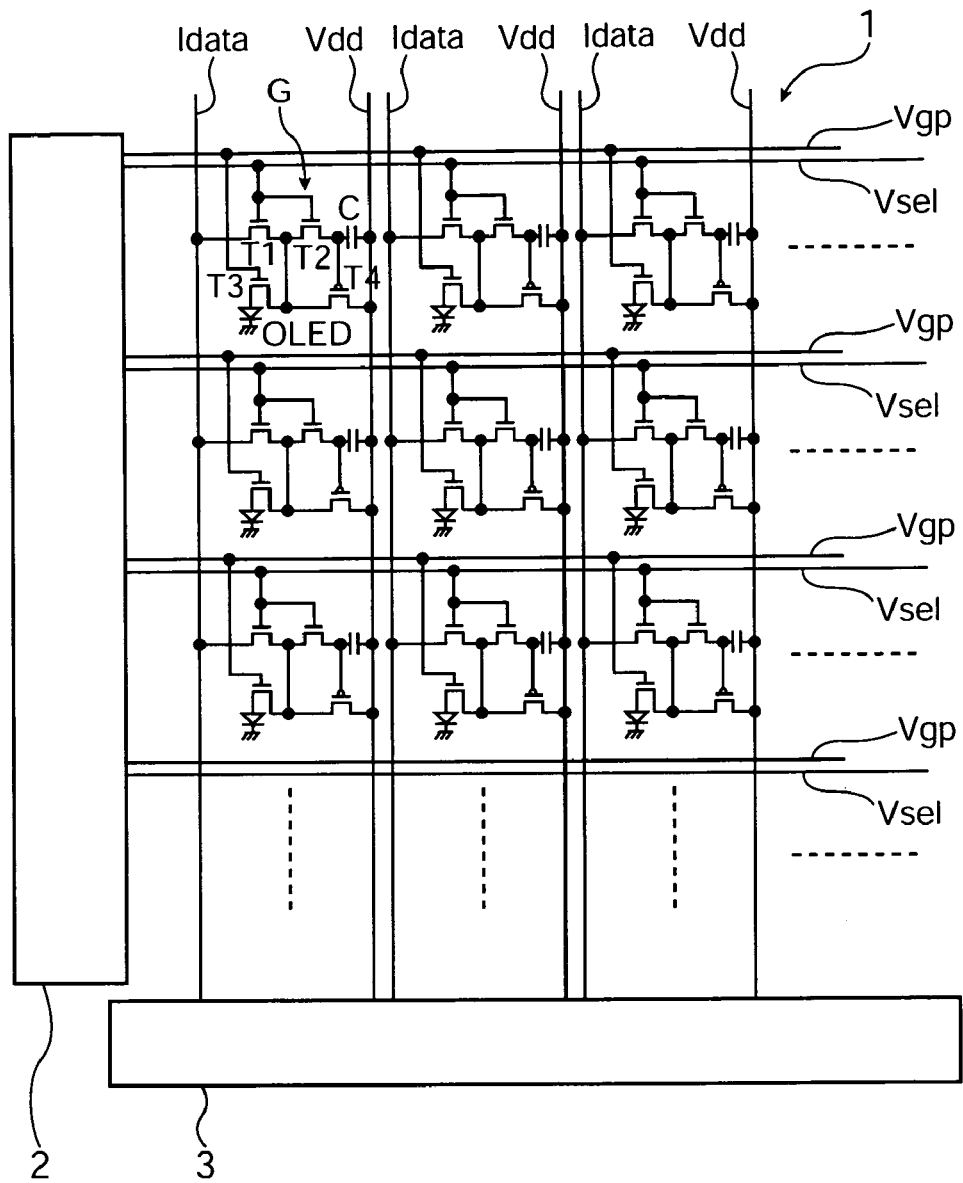
FIG. 9 is a circuit diagram of an electro-optic device of a sixth embodiment of the invention.

FIG. 9 is a circuit diagram of an electro-optic device 1 equipped with a thin film transistor manufactured using the method of manufacturing a thin film device described above.

The electro-optic device 1 has the transfer-target substrate 120 provided with thin film transistors T1 through T4, which are the thin film devices, transferred thereon, the both sides of the transfer-target substrate being provided with the thin film devices. For example, the transfer-target substrate is a transparent substrate provided with a circuit, as the thin film device, composed of thin film transistors formed on one surface thereof, and further provided with organic electroluminescent elements and a color filter formed on the other surface thereof as the thin film devices.

As shown in FIG. 9, in the present electro-optic device 1, each of pixels G is composed of the thin film transistors T1 through T4, an organic electroluminescent element OLED electrically connected from wiring layers 102a through 102d, and a capacitor C, and the pixels G are connected in a matrix manner to scanning lines Vgp and line selecting lines Vsel laid down in the line direction, and power supply lines Vdd and data lines Idata laid down in the column direction. A scan driver 2 is arranged to supply the scanning lines Vgp with scan control signals, and the line selecting lines Vsel with line selecting signals. A current driver 3 is arranged to supply the power supply lines Vdd with a power supply voltage, and the data lines Idata with data signals. The electro-optic device 1 is arranged so that the current from the power supply lines Vdd flows through the organic electroluminescent element OLED when the both of the scanning line Vgp and the data line Idata are set to the selected state.

According to the sixth embodiment, since the electro-optic device is manufactured with the thin film devices formed on both surfaces of the substrate, a requirement of high-density packaging of the thin film devices such as the thin film transistors, and a requirement of making the device itself as a thin film can be satisfied.

Seventh Embodiment

A seventh embodiment of the invention relates an exemplification of an electronic instrument equipped with the electro-optic device according to the embodiment of the invention.

Figure 10A:
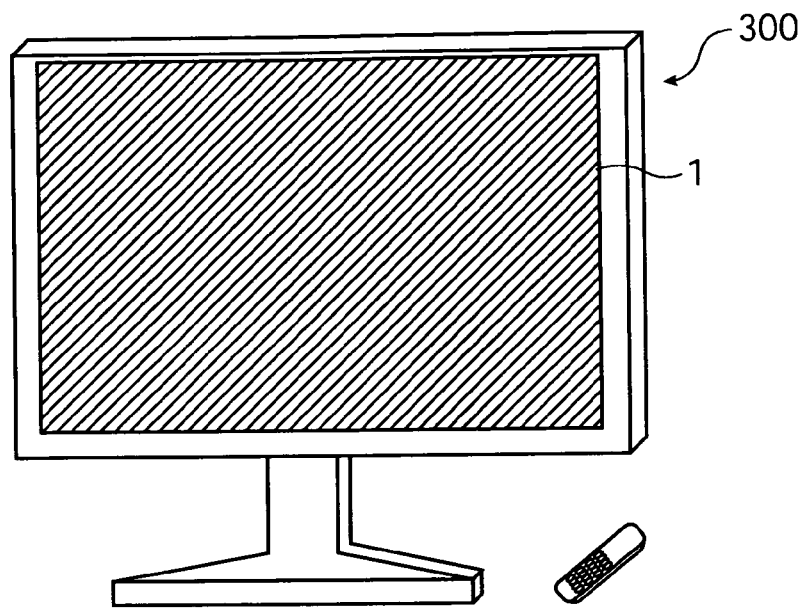
FIGS. 10A and 10B are schematic views showing application examples of an electronic device of a seventh embodiment of the invention.
Figure 10B:
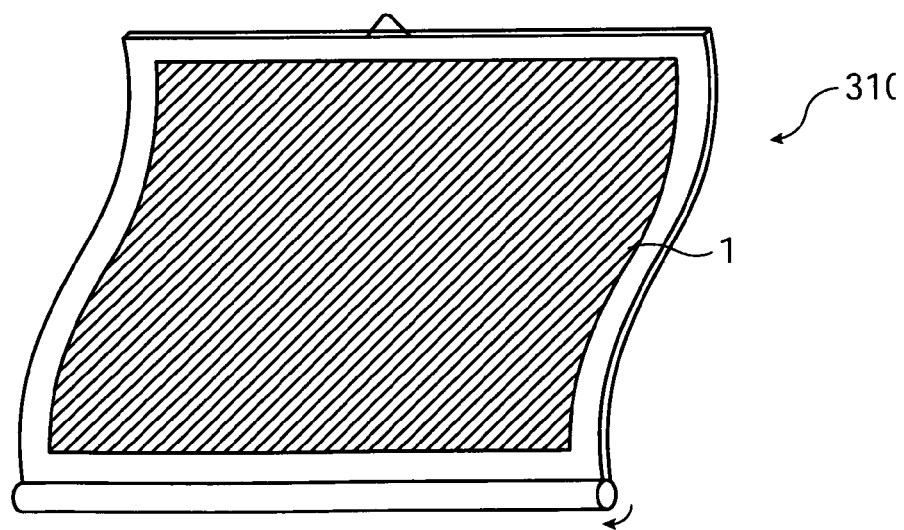

FIGS. 10A and 10B are schematic views showing examples of the electronic instrument equipped with the electro-optic device shown in FIG. 9. FIG. 10A is a television 300 applying the invention, and the electronic instrument is composed of the electro-optic device 1 according to the embodiment of the invention. Further, FIG. 10B is a roll-up television 310 composed of the electro-optic device 1 according to the embodiment of the invention. Since the roll-up television 310 shown in FIG. 10B needs to have flexibility, the end substrate is required to be a plastic substrate or the like made of a material with high elasticity.

Note that the structures of the electro-optic device and the electronic instruments described above are only exemplifications, the invention can be applied to various products using a thin film device manufactured by transferring a thin film device using the method of manufacturing a thin film device according to the above embodiments of the invention.

The method of manufacturing a thin film device according to the invention is not limited to the embodiments described above, but can be put into practice with various modifications. For example, as the thin film device, wiring or an electrode can be included other than the thin film transistor.

Further, the electro-optic device is not limited by types of display elements, but various types of devices such as a liquid crystal device, an electrophoretic device, or an electron emission device can be adopted other than the electroluminescent device.

Further, the electronic instrument is not limited to the structures described above, but, for example, a personal computer, a mobile phone, a video camera, a head-mount display, a rear type or a front type of video projector, a facsimile machine having a display function, a view finder of a video camera, a portable TV, a DSP device, a PDA, an electronic organizer, an electric bulletin board, an IC card, or an advertising display can be adopted.

What is claimed is:

1. A method of manufacturing a thin film device, comprising:
 forming a pair of multi-layered structures each formed by bonding a transfer layer including a thin film device to a temporary transfer substrate, including;
  forming the transfer layer on a transfer-source substrate via a first separation layer separated in accordance with application of a predetermined amount of energy,
  bonding the transfer layer to the temporary transfer substrate, and
  separating the transfer-source substrate from the transfer layer by applying energy to the first separation layer to cause a boundary separation and/or an intra-layer separation in the first separation layer;
 respectively adhering the transfer layers of a pair of the multi-layered structures to both surfaces of a transfer-target substrate; and
 separating the temporary transfer substrate from each of the transfer layers adhered to the transfer-target substrate.

2. The method according to claim 1, wherein the step of bonding the transfer layer to the temporary transfer substrate includes:
 forming a second separation layer separated in accordance with application of a predetermined amount of energy on the temporary transfer substrate; and
 bonding the second separation layer formed on the temporary transfer substrate and the transfer layer to each other via an adhesive layer, and
 wherein the step of separating the temporary transfer substrate includes:
 separating the temporary transfer substrate from the transfer layer by applying energy to the second separation layer to cause a boundary separation and/or an intra-layer separation in the second separation layer.

3. The method according to claim 1, wherein the transfer layers are adhered to the both surfaces of the transfer-target substrate via adhesive layers.

4. The method according to claim 3, wherein the adhesive layer is made of a permanent adhesive.

5. The method according to claim 1, wherein the thin film device includes at least one of a wiring film, an electrode, and a semiconductor device. adhesive.

6. An electro-optic device equipped with a thin film transistor manufactured using the method according to claim 1.

7. An electronic instrument equipped with a thin film transistor manufactured using the method according to claim 1.

* * * * *